(12) United States Patent
Li et al.

(10) Patent No.: US 12,527,169 B2
(45) Date of Patent: Jan. 13, 2026

(54) OLED DISPLAY SUBSTRATE AND METHOD FOR PREPARING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Wei Li, Beijing (CN); Jingjing Xia, Beijing (CN); Bin Zhou, Beijing (CN); Tongshang Su, Beijing (CN); Qinghua Guo, Beijing (CN)

(73) Assignees: Hefei Xinsheng Optoelectronics Technology Co,. Ltd., Hefei (CN); BOE Technology Group Co., Ltd., Beijing (CN)

( * ) Notice: Subject to any disclaimer, the term of this patent is extended or adjusted under 35 U.S.C. 154(b) by 603 days.

(21) Appl. No.: 17/624,735

(22) PCT Filed: Apr. 15, 2021

(86) PCT No.: PCT/CN2021/087438
§ 371 (c)(1),
(2) Date: Jan. 4, 2022

(87) PCT Pub. No.: WO2021/238481
PCT Pub. Date: Dec. 2, 2021

(65) Prior Publication Data
US 2022/0246709 A1  Aug. 4, 2022

(30) Foreign Application Priority Data
May 28, 2020 (CN) .......................... 202010466224.7

(51) Int. Cl.
*H01L 27/32* (2006.01)
*H10K 59/124* (2023.01)
(Continued)

(52) U.S. Cl.
CPC .......... *H10K 59/124* (2023.02); *H10K 59/126* (2023.02); *H10K 59/1201* (2023.02); *H10K 59/87* (2023.02)

(58) Field of Classification Search
CPC ............. H10K 59/126; H10K 59/8792; H10K 59/124; H10K 50/865; H10K 59/00–95; H10K 50/00–88
See application file for complete search history.

(56) References Cited

U.S. PATENT DOCUMENTS

| 2002/0038998 A1* | 4/2002 | Fujita ................... | G09G 3/3233 313/495 |
| 2005/0263775 A1* | 12/2005 | Ikeda ................... | H10K 50/865 257/79 |

(Continued)

FOREIGN PATENT DOCUMENTS

| CN | 104600083 A | 5/2015 |
| CN | 105446039 A | 3/2016 |

(Continued)

OTHER PUBLICATIONS

English Translation of Tang (Year: 2019).*
(Continued)

*Primary Examiner* — Steven B Gauthier
*Assistant Examiner* — Rhys Poniente Sheker
(74) *Attorney, Agent, or Firm* — IPro, PLLC

(57) ABSTRACT

The present disclosure provides an OLED display substrate, a method for preparing the same, and a flexible display device. The OLED display substrate includes a base substrate, and a thin film transistor, a first electrode and a light emitting layer sequentially arranged on the base substrate, the thin film transistor including an active layer, in which the OLED display substrate further includes a light shielding layer arranged between the active layer and the first elec- (Continued)

trode, and the light shielding layer also serves as an insulating layer of the OLED display substrate.

7 Claims, 4 Drawing Sheets

(51) Int. Cl.
*H10K 59/126* (2023.01)
*H10K 59/12* (2023.01)
*H10K 59/80* (2023.01)

(56) References Cited

U.S. PATENT DOCUMENTS

| | | |
|---|---|---|
| 2016/0071911 A1 | 3/2016 | Lee |
| 2017/0192320 A1* | 7/2017 | Wang ................ G02F 1/136209 |
| 2018/0040643 A1 | 2/2018 | Lu et al. |
| 2018/0323347 A1 | 11/2018 | Liu |
| 2019/0172886 A1* | 6/2019 | Ma ....................... H10K 59/124 |
| 2019/0172887 A1* | 6/2019 | Sun ....................... H10K 59/65 |
| 2020/0020757 A1 | 1/2020 | Li et al. |
| 2020/0235177 A1* | 7/2020 | Tang .................... H10K 59/122 |
| 2020/0235345 A1* | 7/2020 | Xia ....................... H10K 59/124 |
| 2020/0243635 A1* | 7/2020 | Lee ....................... H10K 59/126 |
| 2020/0350301 A1 | 11/2020 | Zhai |

FOREIGN PATENT DOCUMENTS

| | | | | |
|---|---|---|---|---|
| CN | 205318069 U | 6/2016 | | |
| CN | 106405922 A | 2/2017 | | |
| CN | 107424935 A | 12/2017 | | |
| CN | 107977632 A | * 5/2018 | ........... | G06K 9/0004 |
| CN | 108987595 A | 12/2018 | | |
| CN | 109192736 A | 1/2019 | | |
| CN | 109616497 A | * 4/2019 | ......... | H01L 27/3246 |
| CN | 111162097 A | 5/2020 | | |
| CN | 111584604 A | 8/2020 | | |

OTHER PUBLICATIONS

National Aeronautics and Space Administration, Science Mission Directorate. (2010). Visible Light. Retrieved Dec. 2, 2024, from NASA Science website: http://science.nasa.gov/ems/09_visiblelight (Year: 2010).*
CN 202010466224.7 first office action.
PCT/CN2021/087438 international search report and written opinion.
CN 202010466224.7 third office action.
1 CN 202010466224.7 second office action.

* cited by examiner

OLED DISPLAY SUBSTRATE AND METHOD FOR PREPARING THE SAME, AND DISPLAY DEVICE

CROSS-REFERENCE TO RELATED APPLICATION

This application is the U.S. national phase of PCT Application No. PCT/CN2021/087438 filed on Apr. 15, 2021, which claims a priority to Chinese Patent Application No. 202010466224.7 filed on May 28, 2020, the disclosures of which are incorporated in their entirety by reference herein.

TECHNICAL FIELD

The present disclosure relates to the field of display technology, in particular to an OLED display substrate, a method for preparing the same, and a display device.

BACKGROUND

Organic electro-luminescent display (OLED) has been widely used in the fields of display, illumination and others, due to its self-illumination, low operating voltage, light weight, flexibility, and high color saturation etc.

The preparation process of the organic electro-luminescent device includes: forming a thin film transistor (TFT) on a base substrate, and forming an anode, a pixel definition layer, a light emitting layer and a cathode in sequence on the base substrate on which the thin film transistor is formed, in which the anode is electrically connected to a drain electrode of the thin film transistor.

However, a portion of the light emitted from the light emitting layer is incident on the active layer of the thin film transistor through the refraction and reflection of the film layer in the organic electro-luminescent device, and this will affect the characteristics of the thin film transistor, and cause the instability of the threshold voltage ($V_{th}$) and the increase of the off-state current ($T_{off}$) of the thin film transistor, both of which affects the light emitting effect. In particular, low temperature poly-silicon (LTPS) thin film transistors in the prior art have a low temperature poly-silicon which is very sensitive to light, and the light emitted from the light emitting layer is incident on the low temperature poly-silicon layer, which will generate photoelectrons, thereby significantly affecting the characteristics of the thin film transistor, and further affecting the display effect of the display device.

SUMMARY

The technical problem to be solved by the present disclosure is to provide an OLED display substrate, a method for preparing the same, and a display device, which is capable of ensuring the display effect of the display device.

To solve the above technical problems, the embodiments of the present disclosure provide technical solutions as follows.

In one aspect, there is provided an OLED display substrate includes a base substrate and a thin film transistor, a first electrode and a light emitting layer sequentially arranged on the base substrate, in which the thin film transistor including an active layer, the OLED display substrate further includes a light shielding layer arranged between the active layer and the first electrode, and the light shielding layer also serves as an insulating layer of the OLED display substrate.

In some embodiments, the light shielding layer has a transmittance of less than 10% for light at a wavelength of 600 nm or less.

In some embodiments, the OLED display substrate includes an overcoat located between the active layer and the first electrode, the light shielding layer also serves as the overcoat, and the overcoat is made of a light shielding organosiloxane resin.

In some embodiments, the overcoat has a thickness in a range from 2 μm to 4 μm.

In some embodiments, the light shielding organosiloxane resin includes a transparent organosiloxane resin and light absorbing particles doped in the transparent organosiloxane resin.

In some embodiments, in the light shielding organosiloxane resin, a weight ratio of the light absorbing particles to the transparent organosiloxane resin is in a range from 1:40 to 2:40.

In some embodiments, the light absorbing particles are at least one selected from carbon black, graphene, and carbon nanotubes.

In some embodiments, the OLED display substrate further includes alignment mark arranged at a periphery of the display region, and the alignment marks and the overcoat are made of the same material.

An embodiment of the present disclosure further provides a display substrate, including the OLED display substrate as described above.

An embodiment of the present disclosure further provides a display device including the OLED display substrate as described above.

An embodiment of the present disclosure further provides a method for preparing an OLED display substrate, including sequentially forming a thin film transistor, a first electrode and a light emitting layer on a base substrate, in which the thin film transistor including an active layer, and the method further includes forming a light shielding layer between the active layer and the first electrode, in which the light shielding layer also serves as an insulating layer of the OLED display substrate.

In some embodiments, the OLED display substrate includes an overcoat located between the active layer and the first electrode, and forming the overcoat includes: mixing light absorbing particles into an organosiloxane resin solution and uniformly stirring, and coating the organosiloxane resin solution on the base substrate on which the thin film transistor is formed, followed by curing to form the overcoat.

In some embodiments, in the organosiloxane resin solution, a weight ratio of the light absorbing particles to the organosiloxane resin is in a range from 1:40 to 2:40.

In some embodiments, the light absorbing particles are at least one selected from carbon black, graphene, and carbon nanotubes.

In some embodiments, after the curing to form the overcoat, the method further includes patterning the overcoat to form a pattern of the overcoat and an alignment mark located at a periphery of the display region.

In some embodiments, the forming the first electrode includes: forming a first electrode material layer on the overcoat; coating a photoresist on the first electrode material layer, aligning a mask with the base substrate by the alignment mark, and exposing the photoresist by using the mask as a shield, followed by developing the photoresist to form a photoresist reserved region and a photoresist unreserved region; and etching the first electrode material layer in the photoresist reserved region, and stripping the remaining photoresist to form the first electrode.

Embodiments of the present disclosure have the following advantageous effects.

In the above technical solutions, the OLED display substrate further includes a light shielding layer arranged between the active layer and the first electrode, the light shielding layer can shield the light emitted from the light emitting layer to prevent the light emitted by the light emitting layer from being incident on the active layer and affecting the characteristics of thin film transistor. Thus the OLED display substrate can stabilize the light emitting characteristics and increase the light emitting stability. In addition, while shielding the light emitted from the light emitting layer, the light shielding layer is also capable of blocking the external ambient light incident onto the OLED display substrate, to prevent the external ambient light from being incident onto the active layer and affecting the characteristics of the thin film transistor. In addition, the light shielding layer is an insulating layer, and thus can avoid the problems that the light shielding layer is easily short-circuited with other conductive patterns and will affect the electrical signals transmitted on other conductive patterns due to the fact that the light shielding layer is made of metal. This is capable of further ensuring the display performance of the OLED display substrate. Furthermore, the light shielding layer also serves as the insulating layer of the OLED display substrate, and there is no need to specially produce the light shielding layer through additional preparing processes, thereby being capable of reducing the number of processes for preparing the OLED display substrate, shortening the production cycle of the OLED display substrate, and reducing the production cost of the OLED display substrate.

Figure 1:
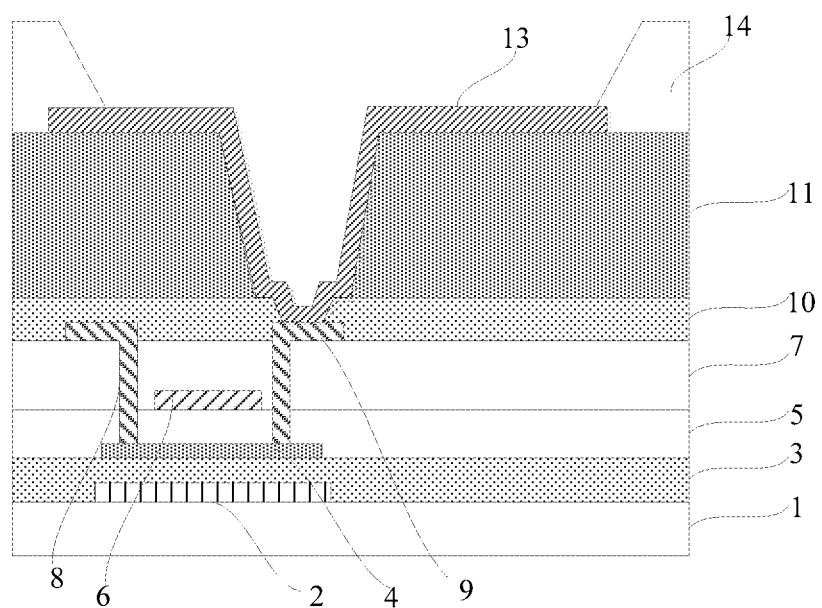
FIG. 1 is a schematic view showing an OLED display substrate according to an embodiment of the present disclosure.

REFERENCE NUMBERS 1 base substrate
2 light shielding metal layer
3 buffer layer
4 active layer
5 gate insulating layer
6 gate electrode
7 interlayer insulating layer
8 source electrode
9 drain electrode
10 passivation layer
11 overcoat
12 via hole
13 anode
14 pixel definition layer
15 alignment mark

DETAILED DESCRIPTION

In order to make the technical problems to be solved, the technical solutions, and the advantages of the examples of the present disclosure, the present disclosure will be described hereinafter in conjunction with the drawings and specific examples.

An embodiment of the present disclosure provides an OLED display substrate, a method for preparing the same, and a display device, which are capable of ensuring the display effect of the display device.

An embodiment of the present disclosure provides an OLED display substrate, including a base substrate and a thin film transistor, a first electrode, and a light emitting layer sequentially arranged on the base substrate; in which the thin film transistor including an active layer, and the OLED display substrate further includes a light shielding layer arranged between the active layer and the first electrode, and the light shielding layer also serves as an insulating layer of the OLED display substrate.

In the embodiments, the OLED display substrate further includes a light shielding layer arranged between the active layer and the first electrode, the light shielding layer can shield the light emitted from the light emitting layer to prevent the light emitted by the light emitting layer from being incident on the active layer and affecting the characteristics of thin film transistor. Thus the OLED display substrate can stabilize the light emitting characteristics and increasing the light emitting stability. In addition, while shielding the light emitted from the light emitting layer, the light shielding layer is also capable of blocking the external ambient light incident onto the OLED display substrate, to prevent the external ambient light from being incident onto the active layer and affecting the characteristics of the thin film transistor. In addition, the light shielding layer is an insulating layer, and thus can avoid the problems that the light shielding layer is easily short-circuited with other conductive patterns and will affect the electrical signals transmitted on other conductive patterns due to the fact that the light shielding layer is made of metal. This is capable of further ensuring the display performance of the OLED display substrate. Furthermore, the light shielding layer also serves as the insulating layer of the OLED display substrate, and there is no need to specially produce the light shielding layer through additional preparing processes, thereby being capable of reducing the number of processes for preparing the OLED display substrate, shortening the production cycle of the OLED display substrate, and reducing the production cost of the OLED display substrate.

It has been verified that light at a wavelength of 600 nm or less has a great impact on the performance of the active layer of the thin film transistor. If light at a wavelength of 600 nm or less is irradiated onto the active layer of the thin film transistor, it will significantly affect the threshold voltage and the off-state current of the thin film transistor. Therefore, the light shielding layer of the present disclosure should be able to block light at a wavelength of 600 nm or less. Specifically, the light shielding layer has a transmittance of less than 10% for light at a wavelength of 600 nm or less, which is capable of effectively avoiding the influence of light on the performance of the thin film transistor, stabilizing the light emitting characteristics of the OLED display substrate, and increasing the light emitting stability. Of course, the light shielding layer also has a shielding effect on light of other wavelengths to some degree.

In a specific embodiment, as shown in FIG. 1, the OLED display substrate includes: a base substrate 1; a light shielding metal layer 2 arranged on the base substrate 1; a buffer layer 3 located on a surface of the light shielding metal layer 2 away from the base substrate 1; an active layer 4 located on the buffer layer 3; a gate insulating layer 5 located on a surface of the active layer 4 away from the base substrate 1; a gate electrode 6 located on a surface of the gate insulating layer 5 away from the base substrate 1; an interlayer insulating layer 7 located on a surface of the gate electrode 6 away from the base substrate 1; a source electrode 8 and the drain electrode 9 located on a surface of the interlayer insulating layer 7 away from the base substrate 1; a passivation layer 10 located on a surface of the source electrode 8 and the drain electrode 9 away from the base substrate 1; an overcoat 11 located on a surface of the passivation layer 10 away from the base substrate 1; a first electrode 13 located on a surface of the overcoat 11 away from the base substrate 1; and a pixel definition layer 14 on a surface of the first electrode 13 away from the base substrate 1. The first electrode 13 may be an anode or cathode.

In this embodiment, the insulating layer located between the active layer and the first electrode includes a gate insulating layer 5, an interlayer insulating layer 7, a passivation layer 10, and an overcoat 11. In the related art, these insulating layers are all transparent insulating layers. In this embodiment, one of the gate insulating layer 5, an interlayer insulating layer 7, a passivation layer 10, and an overcoat 11 may be light-shielding, so as to block the light and prevent the light from being irradiated onto the active layer of the thin film transistor.

If two or more of these insulating layers are designed as light shielding insulating layers, the light transmittance can be further reduced, thereby ensuring the performance of the thin film transistor.

In some embodiments, the light shielding layer may be an overcoat, and the overcoat may have a relatively large thickness. The overcoat is designed as a light shielding layer, thereby effectively shield light. In addition, if the overcoat is designed to be light shielding, it is also possible to use the material of the light shielding overcoat to prepare the alignment mark.

The method for preparing current light emitting layer of OLED display substrate includes a vacuum evaporation process and an inkjet printing process. Vacuum evaporation process has disadvantages, such as low material utilization rate, being only suitable for small molecule light emitting materials, large equipment investment, and being not suitable for large-size products. Inkjet printing process is suitable for both large-molecule luminescent materials and small-molecule luminescent materials, has high a material utilization rate, a low equipment cost, a high productivity, and is easier to produce large-scale and large-sized products.

However, inkjet printing process requires relatively high flatness of the overcoat. If the flatness of the overcoat is not high, the inkjet printing process will not be able to form a light emitting layer having a uniform thickness in the pixel region, and the uneven thickness of the light emitting layer will cause uneven light emission, thereby seriously affecting the display effect. In order to ensure the flatness of the overcoat, an organosiloxane resin with better leveling properties can be used to prepare the overcoat, which is capable of meeting the flatness requirements of the inkjet printing process for the overcoat. Common organosiloxane resin is a transparent material and has no light-shielding function. In this embodiment, light absorbing particles can be added into the common organosiloxane resin to make the organosiloxane resin have light shielding properties. The siloxane resin is used to prepare an overcoat, and the overcoat also serves as a light shielding layer.

The light absorbing particles can be specifically at least one of carbon black, graphene, and carbon nanotubes. The light absorbing particles are doped and stirred uniformly into a transparent organosiloxane resin solution, and coated on the substrate, followed by curing to obtain an overcoat with light shielding performance. Of course, the light absorbing particles are not limited to the above materials, and other materials having light absorbing properties can also be used.

In some embodiments, in the light shielding organosiloxane resin, a weight ratio of the light absorbing particles to the transparent organosiloxane resin may be in a range from 1:40 to 2:40. With the above ratio, the light shielding organosiloxane resin has a transmittance of less than 10% for light at a wavelength of 600 nm or less.

In order to ensure the flatness of the overcoat, the overcoat may have a thickness in a range from 2 μm to 4 μm. When the overcoat has a thickness in a range from 2 μm to 4 μm, it is capable of effectively blocking light to prevent the light from being irradiated on the active layer of the thin film transistor, and having good flatness, which provides good conditions for inkjet printing process.

The OLED display substrate of this embodiment is a top reflective OLED display substrate. The first electrode is generally made of opaque reflective metal. When the first electrode is prepared, the reflective metal is sputtered on the entire layer of the substrate; the photoresist is coated on the reflective metal; the photoresist is exposed and developed by a mask, to form a pattern of the photoresist; and the reflective metal is etched by using the pattern of the photoresist as a mask, to form a pattern of the first electrode. Before the photoresist is exposed and developed by a mask, it is necessary to align the mask with the substrate. However, the reflective metal made into the entire layer will cover the prepared alignment mark, so that it is not easy to align during exposure, and an aligning alarm is prone to occur, which affects the production cycle and has a serious impact on the quality of the display substrate.

Figure 2:
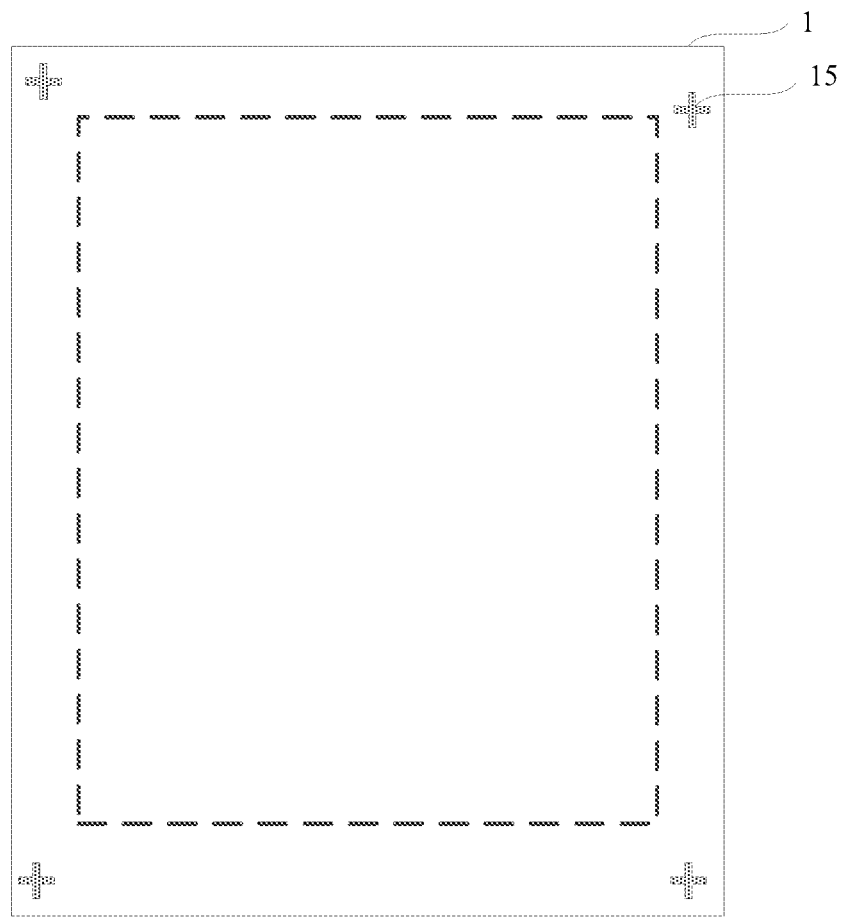
FIG. 2 is a schematic plan view of an OLED display substrate according to one embodiment of the present disclosure.

In this embodiment, the alignment mark can be made of the same material as the overcoat, and the thickness of the overcoat is much larger than the thickness of the reflective metal. In this way, after the alignment mark is made of the same material as the overcoat, even if the reflective metal covers the alignment mark, the outline of the alignment mark can still be clearly exposed because the thickness of the alignment mark is much greater than that of the reflective metal. In this way, when the photoresist on the reflective metal is exposed and developed, the mask can be aligned by using the alignment mark, thereby ensuring the alignment accuracy of the mask, and further ensuring the product quality of the display substrate. In order not to affect the display of the display substrate, as shown in FIG. 2, the alignment mark 15 is arranged on the periphery of the display region (the part within the dashed line frame).

An embodiment of the present disclosure further provides a display substrate, including the OLED display substrate as described above.

An embodiment of the present disclosure further provides a display device including the OLED display substrate as described above. The display device includes, but is not limited to a radio frequency unit, a network module, an audio output unit, an input unit, a sensor, a display unit, a user input unit, an interface unit, a memory, a processor, a power supply and other components. A person skilled in the art will understand that the structures of the above display devices do not constitute a limitation on the display device; and the display device may include more or less of the above-mentioned components, or a combination of certain components, or different arrangements of components. In the embodiment of the present disclosure, the display device includes, but is not limited to, a displayer, a mobile phone, a tablet computer, a television, a wearable electronic device, a navigation display device, and the like.

The display device may be any product or component having a display function, such as a television, a display, a digital photo frame, a mobile phone, a tablet computer, etc., in which the display device further includes a flexible circuit board, a printed circuit board, and a backplane.

An embodiment of the present disclosure further provides a method for preparing an OLED display substrate, including sequentially forming a thin film transistor, a first electrode and a light emitting layer on a base substrate, in which the thin film transistor including an active layer, and the method further includes forming a light shielding layer between the active layer and the first electrode, in which the light shielding layer also serves as an insulating layer of the OLED display substrate.

In the embodiments, the OLED display substrate further includes a light shielding layer arranged between the active layer and the first electrode, the light shielding layer can shield the light emitted from the light emitting layer to prevent the light emitted by the light emitting layer from being incident on the active layer and affecting the characteristics of thin film transistor. Thus the OLED display substrate can stabilize the light emitting characteristics of the OLED display substrate and increase the light emitting stability. In addition, while shielding the light emitted from the light emitting layer, the light shielding layer is also capable of blocking the external ambient light incident onto the OLED display substrate, to prevent the external ambient light from being incident onto the active layer and affecting the characteristics of the thin film transistor. In addition, the light shielding layer is an insulating layer, and thus can avoid the problems that the light shielding layer is easily short-circuited with other conductive patterns and will affect the electrical signals transmitted on other conductive patterns due to the fact that the light shielding layer is made of metal. This is capable of further ensuring the display performance of the OLED display substrate. Furthermore, the light shielding layer also serves as the insulating layer of the OLED display substrate, and there is no need to specially produce the light shielding layer through additional preparing processes, thereby being capable of reducing the number of processes for preparing the OLED display substrate, shortening the production cycle of the OLED display substrate, and reducing the production cost of the OLED display substrate.

It has been verified that light at a wavelength of 600 nm or less has a great impact on the performance of the active layer of the thin film transistor. If light at a wavelength of 600 nm or less is irradiated onto the active layer of the thin film transistor, it will significantly affect the threshold voltage and the off-state current of the thin film transistor. Therefore, the light shielding layer of the present disclosure should be able to block light at a wavelength of 600 nm or less. Specifically, the light shielding layer has a transmittance of less than 10% for light at a wavelength of 600 nm or less, which is capable of effectively avoiding the influence of light on the performance of the thin film transistor, stabilizing the light emitting characteristics of the OLED display substrate, and increasing the light emitting stability. Of course, the light shielding layer also has a shielding effect on light of other wavelengths to some degree.

In a specific embodiment, as shown in FIG. 1, the OLED display substrate includes a base substrate 1; a light shielding metal layer 2 arranged on the base substrate 1; a buffer layer 3 located on a surface of the light shielding metal layer 2 away from the base substrate 1; an active layer 4 located on the buffer layer 3; a gate insulating layer 5 located on a surface of the active layer 4 away from the base substrate 1; a gate electrode 6 located on a surface of the gate insulating layer 5 away from the base substrate 1; an interlayer insulating layer 7 located on a surface of the gate electrode 6 away from the base substrate 1; a source electrode 8 and the drain electrode 9 located on a surface of the interlayer insulating layer 7 away from the base substrate 1; a passivation layer 10 located on a surface of the source electrode 8 and the drain electrode 9 away from the base substrate 1; an overcoat 11 located on a surface of the passivation layer 10 away from the base substrate 1; a first electrode 13 located on a surface of the overcoat 11 away from the base substrate 1; and a pixel definition layer 14 on a surface of the first electrode 13 away from the base substrate 1. The insulating layer located between the active layer and the first electrode includes a gate insulating layer 5, an interlayer insulating layer 7, a passivation layer 10, and an overcoat 11. In the related art, these insulating layers are all transparent insulating layers. In this embodiment, one of the gate insulating layer 5, an interlayer insulating layer 7, a passivation layer 10, and an overcoat 11 may be light-shielding, so as to block the light and prevent the light from being irradiated onto the active layer of the thin film transistor.

If two or more of these insulating layers are designed as light shielding insulating layers, the light transmittance can be further reduced, thereby ensuring the performance of the thin film transistor.

If two or more of these insulating layers are designed as light shielding insulating layers, the light transmittance can be further reduced, thereby ensuring the performance of the thin film transistor. The forming the overcoat includes: mixing and uniformly stirring light absorbing particles into an organosiloxane resin solution, and coating the organosiloxane resin solution on the base substrate on which the thin film transistor is formed, followed by curing to form the overcoat. Specifically, the light absorbing particles may be at least one selected from carbon black, graphene, and carbon nanotubes. The light absorbing particles are doped and stirred uniformly into a transparent organosiloxane resin solution, and coated on the substrate, followed by curing to obtain an overcoat with light shielding performance. Of course, the light absorbing particles are not limited to the above materials, and other materials having light absorbing properties can also be used.

In some embodiments, in the organosiloxane resin solution, a weight ratio of the light absorbing particles to the organosiloxane resin may be in a range from 1:40 to 2:40. With the above ratio, the light shielding organosiloxane resin has a transmittance of less than 10% for light at a wavelength of 600 nm or less.

In these embodiments, if the overcoat is designed to be light shielding, it is also possible to use the material of the light shielding overcoat to prepare the alignment mark.

The OLED display substrate of this embodiment is a top reflective OLED display substrate. The first electrode is generally made of opaque reflective metal. When the first electrode is prepared, the reflective metal is sputtered on the entire layer of the substrate; the photoresist is coated on the reflective metal; the photoresist is exposed and developed by a mask, to form a pattern of the photoresist; and the reflective metal is etched by using the pattern of the photoresist as a mask, to form a pattern of the first electrode. Before the photoresist is exposed and developed by a mask, it is necessary to align the mask with the substrate. However, the reflective metal made into the entire layer will cover the prepared alignment mark, so that it is not easy to align during exposure, and an aligning alarm is prone to occur, which affects the production cycle and has a serious impact on the quality of the display substrate.

In this embodiment, the alignment mark can be made of the same material as the overcoat, and the thickness of the overcoat is much larger than the thickness of the reflective metal. In this way, after the alignment mark is made of the same material as the overcoat, even if the reflective metal covers the alignment mark, the outline of the alignment mark can still be clearly exposed because the thickness of the alignment mark is much greater than that of the reflective metal. In this way, when the photoresist on the reflective metal is exposed and developed, the mask can be aligned by using the alignment mark, thereby ensuring the alignment accuracy of the mask, and further ensuring the product quality of the display substrate. Thus, after the curing to form the overcoat, the method further includes: patterning the overcoat to form a pattern of the overcoat and an alignment mark located at a periphery of the display region. In this way, when the first electrode is formed, the mask can be aligned by the alignment mark, thereby ensuring the alignment accuracy of the mask, and further ensuring the product quality of the display substrate.

Taking the overcoat as the light shielding overcoat as an example, in a specific embodiment, as shown in FIGS. 3 to 7, the method for preparing the OLED display substrate of this embodiment specifically includes the following steps.

Figure 3:
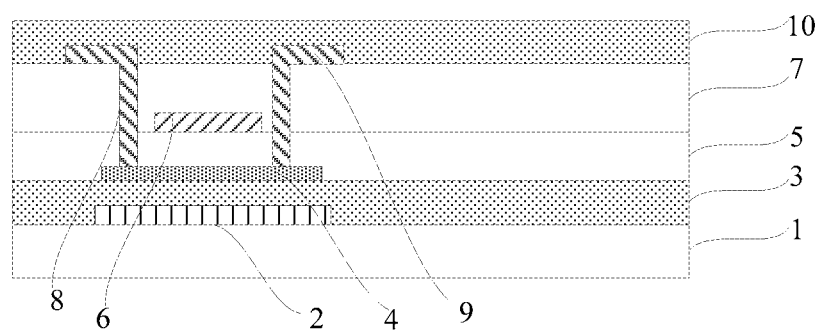
FIGS. 3 to 7 are schematic diagrams showing a method for preparing an OLED display substrate according to one embodiment of the present disclosure.

Step 1. As shown in FIG. 3, a light shielding metal layer 2, a buffer layer 3, an active layer 4, a gate insulating layer 5, a gate electrode 6, an interlayer insulating layer 7, a source electrode 8, a drain electrode 9 and a passivation layer 10 are formed on the base substrate 1. The base substrate 1 may be a glass substrate or a quartz substrate.

Specifically, a light shielding metal layer 2 having a thickness in a range from about 500 Å to 4,000 Å may be deposited on the base substrate 1 by sputtering or thermal evaporation. The material of the metal layer may be selected from Cu, Al, Ag, Mo, Cr, Nd, Ni, Mn, Ti, Ta, W and other metals and alloys of these metals, and the light shielding metal layer 2 may be a single-layer structure or a multi-layer structure, such as Cu\Mo, Ti\Cu\Ti, and Mo\Al\Mo. A layer of photoresist is coated on the light shielding metal layer, and the photoresist is exposed by using a mask to form a photoresist unreserved region and a photoresist reserved region. The photoresist reserved region corresponds to a region in which the pattern of the light shielding metal layer is located, and the photoresist unreserved region corresponds to a region outside of the above pattern. A development processing is performed, so that the photoresist in the photoresist unreserved region is completely removed, and the thickness of the photoresist in the photoresist reserved region remains unchanged. The light shielding metal layer of the photoresist unreserved region is completely etched away by an etching process, and the remaining photoresist is stripped to form a pattern of the light shielding metal layer 2.

Thereafter, a plasma enhanced chemical vapor deposition (PECVD) method may be used to deposit a buffer layer 3 having a thickness in a range from 500 Å to 5000 Å on the base substrate 1. The material of the buffer layer 3 can be selected from an oxide, nitride, or oxynitride compound.

Afterwards, a layer of semiconductor material can be deposited on the buffer layer 3 to form the active layer 4.

Afterwards, the PECVD method can be used to deposit a gate insulating layer 5 having a thickness in a range from 500 Å to 5000 Å on the base substrate 1. The material of the gate insulating layer 5 can be selected from an oxide, nitride, or oxynitride compound.

Afterwards, a gate metal layer having a thickness in a range from 500 Å to 4,000 Å may be deposited on the gate insulating layer 5 by sputtering or thermal evaporation. The material of the gate metal layer may be Cu, Al, Ag, Mo, Cr, Nd, Ni, Mn, Ti, Ta, W and other metals and alloys of these metals, and the gate metal layer may be a single-layer structure or a multi-layer structure, such as Cu\Mo, Ti\Cu\Ti, and Mo\Al\Mo. A layer of photoresist is coated on the gate metal layer, and the photoresist is exposed by using a mask to form a photoresist unreserved region and a photoresist reserved region. The photoresist reserved region corresponds to a region in which the pattern of the gate metal layer is located, and the photoresist unreserved region corresponds to a region outside of the above pattern. A development processing is performed, so that the photoresist in the photoresist unreserved region is completely removed, and the thickness of the photoresist in the photoresist reserved region remains unchanged. The gate metal layer of the photoresist unreserved region is completely etched away by an etching process, and the remaining photoresist is stripped to form a pattern of the gate metal layer including a gate electrode 6.

Afterwards, the PECVD method can be used to deposit an interlayer insulating layer 7 having a thickness in a range from 500 Å to 5000 Å on the base substrate 1. The material of the interlayer insulating layer 7 can be selected from an oxide, nitride, or oxynitride compound.

Afterwards, a source/drain metal layer having a thickness in a range from 500 Å to 4,000 Å may be deposited on the interlayer insulating layer 7 by sputtering or thermal evaporation. The material of the source/drain metal layer may be Cu, Al, Ag, Mo, Cr, Nd, Ni, Mn, Ti, Ta, W and other metals and alloys of these metals, and the source/drain metal layer may be a single-layer structure or a multi-layer structure, such as Cu\Mo, Ti\Cu\Ti, and Mo\Al\Mo. A layer of photoresist is coated on the source/drain metal layer, and the photoresist is exposed by using a mask to form a photoresist unreserved region and a photoresist reserved region. The photoresist reserved region corresponds to a region in which the pattern of the source/drain metal layer is located, and the photoresist unreserved region corresponds to a region outside of the above pattern. A development processing is performed, so that the photoresist in the photoresist unreserved region is completely removed, and the thickness of the photoresist in the photoresist reserved region remains unchanged. The source/drain metal layer of the photoresist unreserved region is completely etched away by an etching process, and the remaining photoresist is stripped to form a pattern of the source/drain metal layer including a source electrode 8 and a drain electrode 9 for driving thin film transistor.

Afterwards, a passivation layer 10 having a thickness in a range from 2000 Å to 10000 Å can be deposited on the base substrate 1 by magnetron sputtering, thermal evaporation, PECVD or other film forming methods. The material of the passivation layer 10 can be selected from an oxide, nitride, or oxynitride compound, such as SiO.

Figure 4:
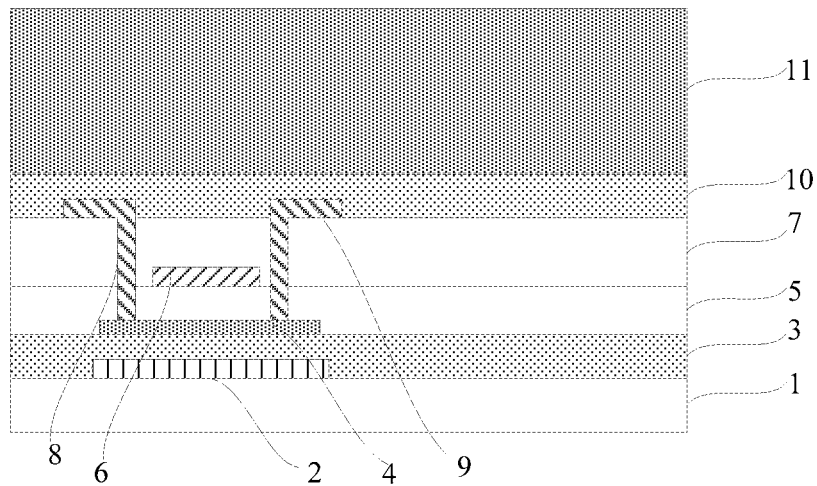

Step 2. As shown in FIG. 4, a light shielding overcoat 11 is formed.

Specifically, the light absorbing particles are mixed and stirred uniformly into an organosiloxane resin solution, and the organosiloxane resin solution is coated on the base substrate 1 on which the thin film transistor is formed, followed by pre-baking and post-baking processes and curing to form the overcoat 11. The flatness of the overcoat 11 can meet the flatness requirements of inkjet printing, and the overcoat 11 has a transmittance of less than 10% for light at a wavelength of 600 nm or less.

Figure 5:
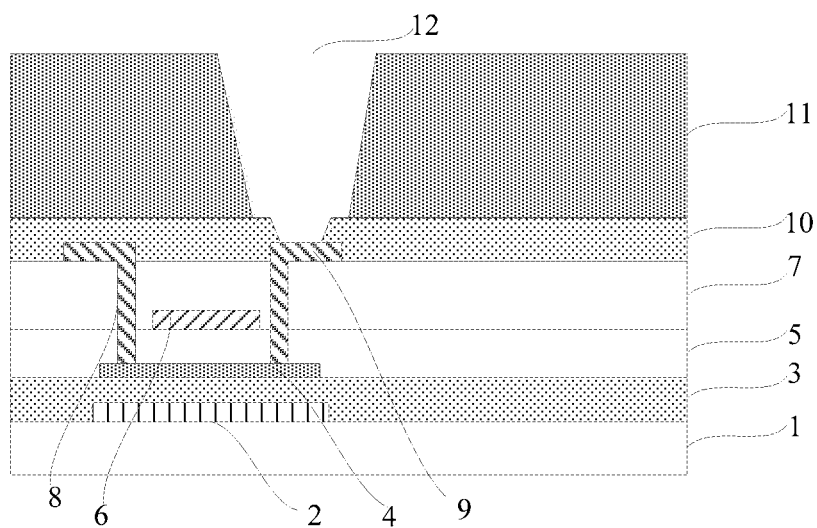

Step 3. As shown in FIG. 5, a via hole 12 penetrating the passivation layer 10 and the overcoat 11 is formed.

Specifically, a photoresist can be coated on the overcoat 11, the photoresist can be exposed and developed to form a photoresist reserved region and a photoresist unreserved region. A dry etching is performed on the overcoat 11 and the passivation layer 10 in the photoresist unreserved region, to form a via hole 12, and then the photoresist is stripped. When the pattern of the overcoat 11 is formed, the material of the overcoat is also used to form an alignment mark 15 as shown in FIG. 2 on the periphery of the display region.

Figure 6:
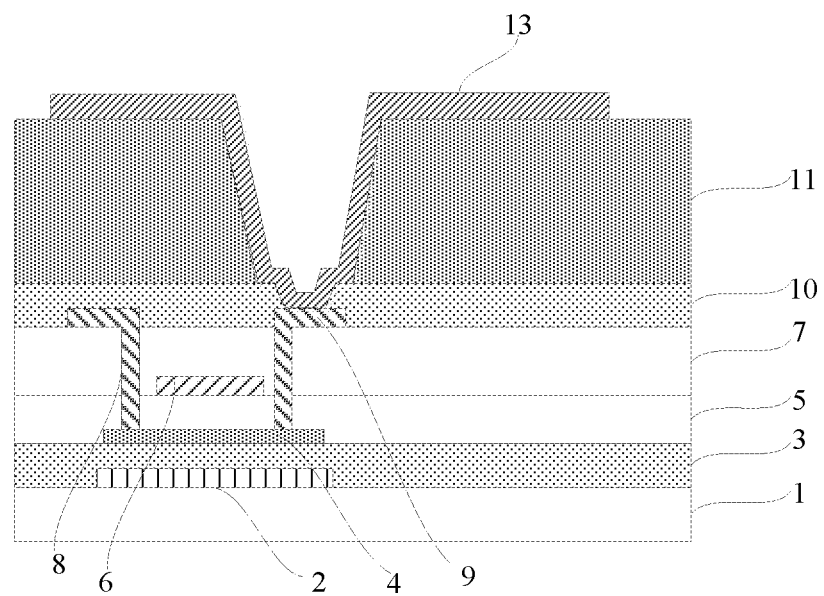

Step 4. As shown in FIG. 6, a first electrode 13 is formed.

Specifically, a first electrode material layer may be formed on the overcoat 11, a photoresist is coated on the first electrode material layer, a mask is aligned with the base substrate 1 by the alignment mark 15, and the photoresist is exposed by using the mask as a shield, followed by developing the photoresist to form a photoresist reserved region and a photoresist unreserved region. The first electrode material layer in the photoresist reserved region is etched, and the remaining photoresist is stripped to form the first electrode 13. Specifically, the first electrode 13 may be an anode, and the material of the first electrode may be a reflective metal, such as Al or Ag.

Figure 7:
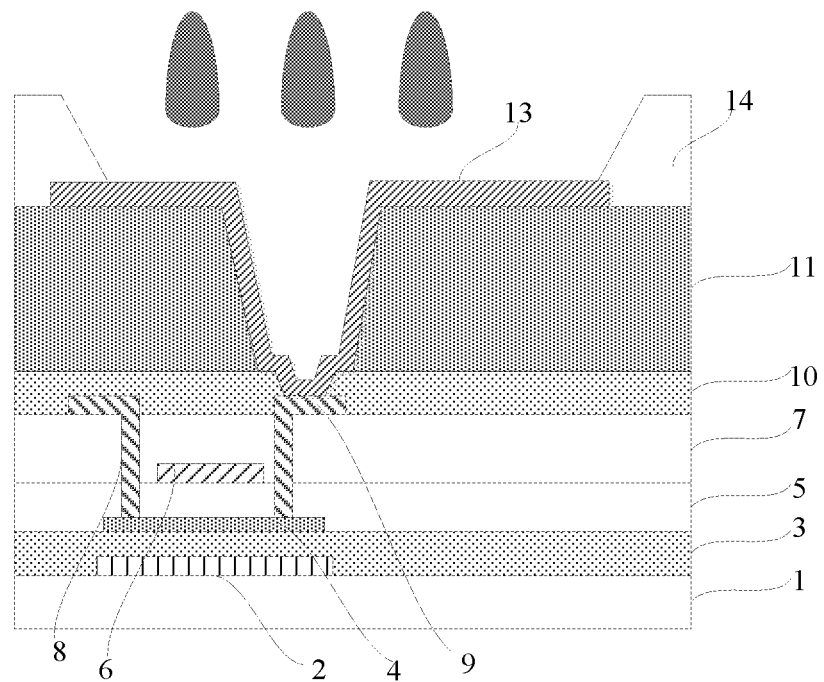

Step 5. As shown in FIG. 7, a pixel defining layer 14 is formed.

Specifically, a layer of photosensitive material may be formed on the base substrate 1 that has undergone step 4, and the photosensitive material layer may be exposed and developed to form a pattern of the pixel definition layer 14. The pixel definition layer 14 defines the pixel opening region. Afterwards, the light emitting layer can be formed in the pixel opening region by an inkjet printing process.

The OLED display substrate prepared in this embodiment can not only ensure the flatness of the overcoat and meet the needs of an inkjet printing process, but also solve the problem of instability of the active layer of the thin film transistor after being exposed to light. In addition, an alignment mark is also formed on the periphery of the display region, to ensure the normal progress of the patterning process of the first electrode.

In the method embodiments of the present disclosure, the serial numbers of the steps cannot be used to define the sequence of the steps. As for one skilled in the art, the changes in the order of steps without paying creative work also fall within the scope of the present disclosure.

It should be noted that each example in the present specification are described in a progressive manner, and the same or similar parts among the various examples may be referred to each other, and each example focuses on differences from other examples. In particular, as for the examples, since they are basically similar to the product examples, the description thereof is relatively simple, and the relevant parts may be referred to description of the product examples.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. An organic light emitting diode (OLED) display substrate, comprising a base substrate, and a thin film transistor, a first electrode and a light emitting layer sequentially arranged on the base substrate,
    wherein the thin film transistor comprises an active layer, and the OLED display substrate further comprises a gate insulating layer, an interlayer insulating layer, a passivation layer, and an overcoat located between the active layer and the first electrode,
    wherein the OLED display substrate further comprises light shielding layers arranged between the active layer and the first electrode, and the light shielding layers also serve as the gate insulating layer and the overcoat,
    wherein the light shielding layer has a transmittance of less than 10% for light at a wavelength of 600 nm or less,
    wherein the overcoat has a thickness of 2 μm to 4 μm, and is made of a light shielding organosiloxane resin,
    wherein the light shielding organosiloxane resin comprises a transparent organosiloxane resin and light absorbing particles doped in the transparent organosiloxane resin, and the light absorbing particles are carbon nanotubes,
    wherein the OLED display substrate comprises protruded alignment marks arranged at a periphery of a display region, and
    wherein in the light shielding organosiloxane resin, a weight ratio of the light absorbing particles to the transparent organosiloxane resin is in a range from 1:40 to 2:40.

2. The OLED display substrate of claim 1, wherein the protruded alignment marks and the overcoat are made of a same material.

3. A display panel, comprising the OLED display substrate of claim 1.

4. A display device, comprising the OLED display substrate of claim 1.

5. A method for preparing an OLED display substrate, comprising sequentially forming a thin film transistor, a first electrode and a light emitting layer on a base substrate, wherein the thin film transistor comprises an active layer, and the OLED display substrate further comprises a gate insulating layer, an interlayer insulating layer, a passivation layer, and an overcoat located between the active layer and the first electrode, wherein the method further comprises forming light shielding layers between the active layer and the first electrode, and the light shielding layers also serve as the gate insulating layer and the overcoat, wherein the light shielding layer has a transmittance of less than 10% for light at a wavelength of 600 nm or less, wherein the overcoat has a thickness of 2 μm to 4 μm, and is made of a light shielding organosiloxane resin, wherein the light shielding organosiloxane resin comprises a transparent organosiloxane resin and light absorbing particles doped in the transparent organosiloxane resin, and the light absorbing particles are carbon nanotubes, wherein the OLED display substrate comprises protruded alignment marks arranged at a periphery of a display region, and wherein in the light shielding organosiloxane resin, a weight ratio of the light absorbing particles to the transparent organosiloxane resin is in a range from 1:40 to 2:40, and wherein forming the light shielding layers comprises:

mixing light absorbing particles into an organosiloxane resin solution and stirring, and coating the organosiloxane resin solution on the base substrate, followed by curing to form the light shielding layers.

6. The method of claim 5, wherein after the curing to form the overcoat, the method further comprises:

patterning the overcoat to form a pattern of the overcoat and the alignment mark located at a periphery of the display region.

7. The method of claim 6, wherein the forming the first electrode comprises:

forming a first electrode material layer on the overcoat;

coating a photoresist on the first electrode material layer, aligning a mask with the base substrate by the alignment mark, and exposing the photoresist by using the mask as a shield, followed by developing the photoresist to form a photoresist reserved region and a photoresist unreserved region; and etching the first electrode material layer in the photoresist reserved region, and stripping the remaining photoresist to form the first electrode.

* * * * *